United States Patent [19]
Borowiec et al.

[11] Patent Number: 6,060,659
[45] Date of Patent: *May 9, 2000

[54] ELECTRONIC ISOLATION SHIELD AND A METHOD OF DETERMINING THE MINIMUM NUMBER OF SECURING POINTS REQUIRED ON THE SHIELD TO SUFFICIENTLY SECURE THE SHIELD TO A CIRCUIT BOARD

[75] Inventors: Joseph A. Borowiec, Brooklyn, N.Y.; Behzad Davachi Mottahed, Upper Montclair; Richard G. Witty, Kinnelon, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/901,870

[22] Filed: Jul. 29, 1997

[51] Int. Cl.[7] ....................................................... H05K 9/00
[52] U.S. Cl. ............................................................ 174/35 R
[58] Field of Search .......................... 174/35 R; 361/816, 361/818, 800, 801, 753; 439/108

[56] References Cited

U.S. PATENT DOCUMENTS

| | | | |
|---|---|---|---|
| 5,117,330 | 5/1992 | Miazga | 361/760 |
| 5,508,889 | 4/1996 | Li | 361/816 |
| 5,557,063 | 9/1996 | Mottahed | 174/35 GC |

*Primary Examiner*—Kristine Kincaid
*Assistant Examiner*—Hung V Ngo
*Attorney, Agent, or Firm*—Darby & Darby

[57] ABSTRACT

An electronic isolation shield mounts on a circuit board, around an electronic component to provide a minimum amount of shielding over a set period of time. The shield has a body made from a shielding material that is sized and shaped to fit around and cover the electronic component. The body has a sealing edge that is adapted to contact an upper surface of the circuit board and surround the electronic component. Resilient downwardly projecting tabs are attached to the body and each includes a securing end that extends past the sealing edge. The tab is securable to the circuit board along a securing axis. The sealing edge of the body is forced into sealing engagement with the upper surface of circuit board. The tab is laterally displaced with respect to the securing axis continuously over the set period of time so that the sealing edge is forced into the circuit board sufficiently to provide the minimum amount of shielding to the electronic component over the set period of time. A method of determining the minimum number of tabs that are required includes ascertaining the creep strain for the tab material, determining the mathematical ratio between pressure applied by the tabs at the beginning of the shield's service life to the pressure applied at the end of the service life, determining the minimum amount of pressure that is required to be applied by the tabs throughout the service life, and determining the minimum number of tabs that are required to apply the determined minimum pressure throughout the entire set period of time based on the determined mathematical ratio.

6 Claims, 4 Drawing Sheets

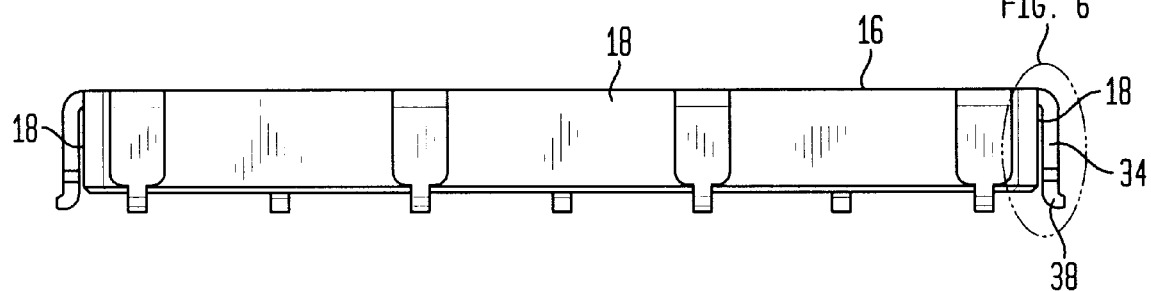
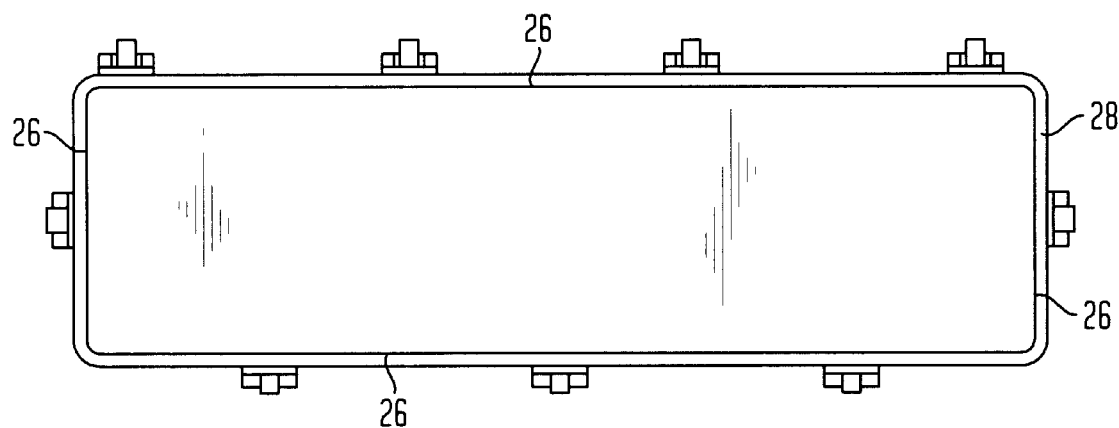
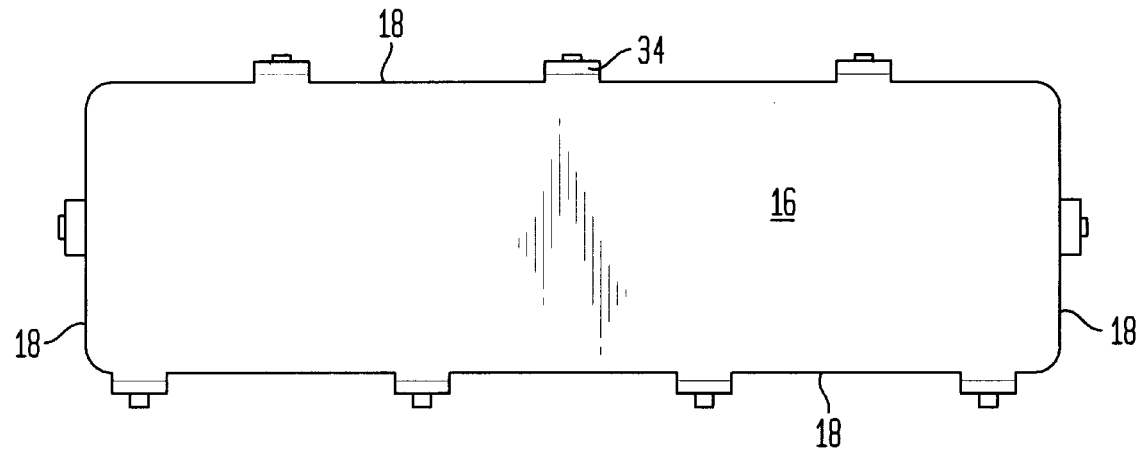

ELECTRONIC ISOLATION SHIELD AND A METHOD OF DETERMINING THE MINIMUM NUMBER OF SECURING POINTS REQUIRED ON THE SHIELD TO SUFFICIENTLY SECURE THE SHIELD TO A CIRCUIT BOARD

BACKGROUND OF THE INVENTION

1. Field of the Invention

The present invention relates to component shielding. More specifically, the present invention relates to an electronic isolation shield for mounting to a circuit board, around an electronic component mounted thereon, and a method for determining the number of securing points required on the shield to sufficiently secure the shield to the circuit board.

2. Discussion of the Related Art

Isolation of certain components from sources of electromagnetic interference (EMI) is particularly important in communications equipment, such as, for example, cellular telephones and related relay station equipment, which have components that operate in at least the 50 MHz to 4 GHz frequency range. Conventional radio frequency (rf) isolation shields for electronic components do not provide sufficient shielding (i.e., greater than 60 dBm) without requiring the use of a large number of screws and a gasket to secure the shield to the component. More than one screw for each linear inch along the perimeter of the shield may be required at 1000 MHz to sufficiently ground and stably secure the shield walls to the planar surface of the electronic component (e.g., a printed circuit or p.c. board). Additionally, gaskets tend to leak when they are installed because of, inter alia, mechanical damage to the thin gasket material, an improper placement of the gasket material during assembly, or damage to the gasket material caused by heat, all of which cause EMI leakage. Furthermore, a new gasket may be needed each time the shield is reassembled, thereby increasing the costs associated with using a conventional shield.

Other attempts at providing a shield include the use of a cap that is attached and grounded by soldering. But soldering is expensive and may be less reliable than a screw and gasket mounting, especially if the cap has been removed and reattached. The reattached solder cap is generally less reliable because air gaps and other surface irregularities that typically form when the solder around the cap is removed may remain after the cap is re-soldered. Moreover, these caps may be difficult to unsolder and the unsoldering operation itself is risky, possibly causing heat damage to the electronic components or delaminating portions of the circuit board assembly.

U.S. Pat. No. 5,557,063, which includes a common inventor with the present application and is commonly assigned, is directed towards an electronic isolation shield that has a tongue on a sealing edge wall of the shield and a corresponding groove in the surface of the electronic component to provide effective shielding without the use a gasket. The disclosure of U.S. Pat. No. 5,557,063 is hereby incorporated by reference. The shield may be attached to the circuit board assembly using either screws or a snap fit as illustrated in FIGS. 3A and 3B of the '063 patent. However, we have discovered that, due to the effects of creep, the holding force of the resilient tabs in the snap fit embodiment decreases over time. The effects of creep are particularly pronounced when the shield is exposed to an environment of elevated temperatures, which is typical for much of its service life. The typical elevated temperature ranges from above room temperature to about 75° C. Additionally, when attaching the shield onto the circuit board assembly, the tabs should not be overstressed nor should undue stress be applied to the electronic component assembly.

SUMMARY OF THE INVENTION

These and further objects of the present invention are achieved by an electronic isolation shield that mounts on a circuit board, around an electronic component to provide a minimum amount of shielding over a set period of time. The shield has a body made from a shielding material that is sized and shaped to fit around and cover the electronic component. The body has a sealing edge that is adapted to contact an upper surface of the circuit board and surround the electronic component. A resilient downwardly projecting tab is attached to the body and includes a securing end that extends past the sealing edge. The tab is securable to the circuit board along a securing axis. The sealing edge of the body is forced into sealing engagement with the upper surface of circuit board. The tab is laterally displaced with respect to the securing axis continuously over the set period of time so that the sealing edge is forced into the circuit board sufficiently to provide the minimum amount of shielding to the electronic component over the set period of time.

Accordingly, an electronic isolation shield accounts for the effects of creep so that a predetermined minimum pressure is applied by the tabs throughout the entire service life of the shield (approximately 5 years). In accordance with aspects of our invention the tabs account for variations in thickness of circuit board component assemblies, tolerances in the thickness of any given circuit board assembly and tolerances in the length of the tab itself, yet occupy a minimum of space on the circuit board, will not overstress when the shield is snapped onto the circuit board, and minimally stresses the circuit board assembly when the shield is snapped onto the circuit board assembly.

BRIEF DESCRIPTION OF THE DRAWINGS

The above and still further, features and advantages of the present invention will become apparent upon consideration of the following detailed description of a specific embodiment thereof, especially when taken in conjunction with the accompanying drawings wherein like reference numerals in the various figures are utilized to designate like components, and wherein:

FIG. 2 is a front view of the shield of the embodiment of FIG. 1;

FIG. 3 is a bottom view of the shield of the embodiment of FIG. 1;

FIG. 4 is a top view of the shield of the embodiment of FIG. 1;

DETAILED DESCRIPTION OF A PREFERRED EMBODIMENT

Figure 1:
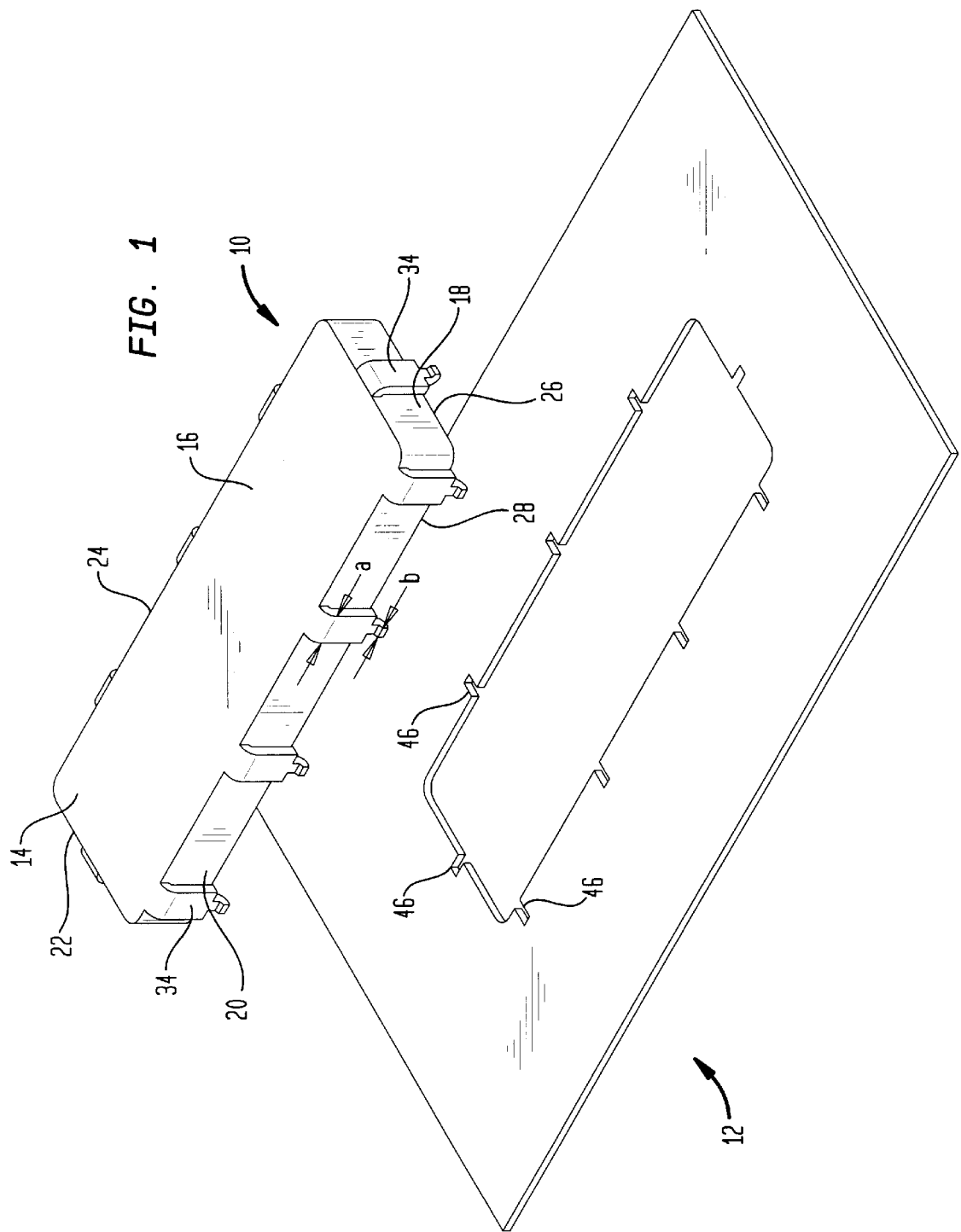
FIG. 1 is an assembly view of a specific illustrative embodiment of an electronic isolation shield and circuit board assembly according to our invention, prior to assembly.
Figure 5:
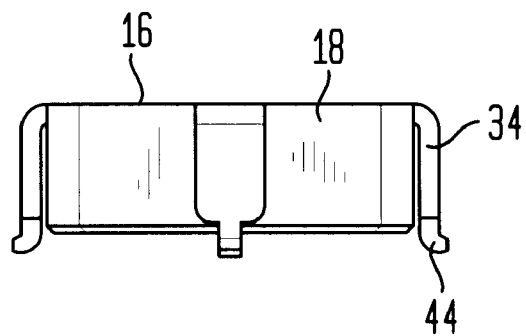
FIG. 5 is a right side view of the shield of the embodiment of FIG. 1.
Figure 6:
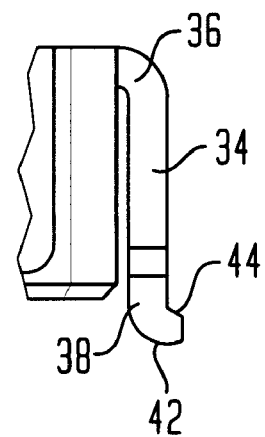
FIG. 6 is an enlarged partial front view of the shield, showing one of the tabs, and corresponds to detail A of FIG. 2.

Referring now to FIGS. 1–9, an rf electronic isolation shield 10 for mounting on a circuit board assembly 12 is illustrated. Shield 10 is sized and shaped according to the size and shape of circuit board 12 and the size and shape of the items being shielded and the surrounding components. As way of illustration, the shape of shield 10 is box-rectangular. Shield 10 includes a cup shaped housing 14 that has a rectangular upper wall 16 and four rectangular side walls 18. Each side wall 18 is preferably formed as a downwardly directed extension of upper wall 16. The juncture of upper wall 16 and each side wall 18 defines a corner edge. Each side wall 18 has a lower edge 26, which collectively define a sealing edge 28 of shield 10 (see FIG. 3).

A select number of tabs 34 are attached to and depend downwardly from side walls 18. Tabs 34 are adapted to secure shield 10 to circuit board 12 by fitting into pre-formed openings 46 located through circuit board 12. Each tab 34 has a fixed end 36 and a fastening end 38 (see FIG. 2).

Figure 7:
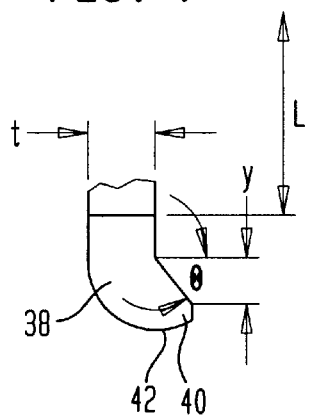
FIG. 7 is an enlarged partial view of one tab, showing details of a lower portion thereof illustrative of our invention.
Figure 8:
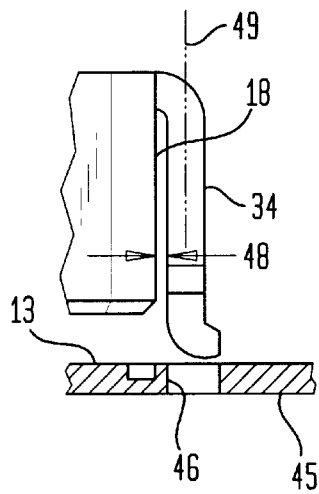
FIG. 8 is an enlarged partial view of the shield and circuit board, showing details of one tab prior to assembly.

Fastening end 38 extends below sealing edge 28 of shield 10 and, as shown in FIG. 7, includes a tab extension 40. Each fixed end 36 is connected to side wall 18 at predetermined tab points preferably immediately adjacent to upper wall 16 at or near the corner edge. Tab extension 40 of each tab 34 includes a curved lower surface 42 which facilitates the insertion of each respective tab 34 into each respective opening 46 of circuit board 12. Each tab extension 40 further includes an upward-facing planar locking surface 44 that is sized and shaped to fractionally engage a lower surface 45 of circuit board 12 upon insertion of each tab 34 into each respective opening 46, as seen in FIG. 8. This engagement of locking surface 44 of each tab 34 with circuit board 12 maintains shield 10 in tight shielding contact with circuit board 12.

Angle θ is the intersection of contact surface 44 with a horizontal reference plane 51, which is parallel to the lower surface 45 of the circuit board 12. Angle θ is determined (as described below) to account for differences in thickness of different circuit boards (which currently generally vary between different boards from 25 mils. to 65 mils.), tolerances in the thickness of a single circuit board 12, and tolerance in the length of each tab 34. Angle θ is preferably greater than 10° and less than 80°.

Figure 9:
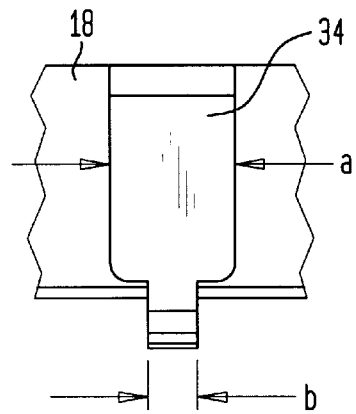
FIG. 9 is an enlarged partial view of one tab.

It is preferred that the cross-sectional area (a×t) of tab 34, measured at a first plane parallel to and immediately above sealing edge is formed larger than the cross-sectional area (b×t) of tab 34, measured at a second plane that is parallel to and located immediately below sealing edge, as illustrated in FIG. 9. Although the cross-sectional area ratio (b×t)I(a× t)=b/a may be 1.00, a ratio of less than 1.00 (e.g., 0.25 to 1.00) is preferred so that the size of openings 46 may be minimized, which in turn, reduces the real estate required to secure the shield to circuit board assembly.

Referring to FIG. 8, it is preferred that tab 34 (in a rest position) is positioned adjacent and generally parallel to side wall 18 so that an intermediate gap 48 is established. Thus, each tab is securable to the circuit board along a securing axis 49 (see FIG. 8). Thus, as shield 10 is pushed towards circuit board 12, tabs 34 displace inwardly (toward their respective side wall 18) as their curved lower surfaces 42 of fastening ends 38 align with and enter into respective openings 46. The inwardly directed displacement of tabs 34 is made against the natural resiliency of tabs 34. Once tabs 34 are fastened to circuit board 12 and each respective tab extension 40 passes below lower surface 45 of circuit board 12, the natural resiliency of tabs 34 force tabs 34 towards their rest position, outwardly and away from side walls 18. This outward movement of tabs 34 forces each respective contact surface 44 into tight contact with lower surface 45 of circuit board 12, which owing to angle θ, generates a downward directed force that effectively draws sealing edge 28 into tight sealing engagement with an upper surface 13 of circuit board 12. This downward directed force is herein referred to as the beginning-of-life force ($F_{BOL}$).

According to the present invention, shield 10 is attached to circuit board assembly 12 with a minimum degree of pressure so that a predetermined minimum level of shielding is provided. For example, in one embodiment, a minimum amount of 60 dB rf isolation is required from the shield. For a sealing edge length (i.e., shield perimeter) of 7.6 inches and a shield wall thickness of 0.1 inches, it was determined that a minimum of four pounds (4 lbs.) of direct retention force was required to be applied by the tabs onto the printed circuit (p.c.) board. This minimum amount of force is required throughout the entire service life of the shield, which is typically 5 years. Thus, the minimum required force to be applied by the tabs at the end of the service life ($F_{EOL}$) is 4 lbs.

Due to the effects of creep on the shield's tabs, the force applied by the tabs at the beginning of the service life $F_{BOL}$ must be greater than $F_{EOL}$. To account for creep, the creep strain of the material must first be determined. In one embodiment, the shield is made of the polymer known as RTP 383™, which is a nickel coated graphite fiber embedded in polycarbonate having 20% graphite by weight. RTP 383 is a well known composite polycarbonate and is commercially available from the RTP Co. of Winona, Minn. Another acceptable material is Celstrans PCS10-01, which is a stainless steel fiber embedded in polycarbonate and is available from Polymer Composite Incorporated a division of Hoechst Celanes of Winona, Minn. The creep strain for this material can be determined by one of ordinary skill in the art using the following standard creep law:

$$\epsilon_{cr} = \frac{C_1}{C_3 + 1} \sigma^{C_2} t^{C_3+1} e^{-C_4(T)}$$

$\epsilon_{cr}$ = creep strain of the material $\sigma$ = stress applied to the material (psi)

$t$ = time (hours)

$T$ = Temperature (absolute)

The constants $C_1$, $C_2$ and $C_3$ and parameter $C_4$ can be determined by one skilled in the art, by generating data regarding the creep of the material over various controlled experiments where the temperature (T) and the time (t) of applying the stress are varied. ASTM standard D 2990-95 provides test methods for determining creep stain. Parameter $C_4$(T) varies dependent upon the absolute temperature T, and, therefore, is a function of T.

For material RTP 383, we have determined, by using the above technique, that at 50° C. $C_1$=136.7; $C_2$=0.9787; $C_3$=−0.8680; and $C_4$(323° K)=21.68. To account for the variations in the temperature during the surface life of the shield, the temperature is assumed to be a constant ambient temperature of 50° C., which is equal to a 323° K Absolute.

Thus, utilizing a conventional finite element analysis (FEA) for the dimension of tabs 34 and properties of the material, including Young's Modulus (E), which is 1,100,000 psi for RTP 383, creep strain ($\epsilon cr$), the force at the beginning of life $F_{BOL}$ is related to the force at the end of life (service life=5 years), according to the equation $F_{EOL}=0.38\ F_{BOL}$ for RTP 383. Of course, this mathematical relationship will vary depending upon the material being used, the overall structure, the ambient temperature, and the service life. Additionally, the finite element analysis was done under the assumption that the width of tab ratio b/a=1. For different b/a ratios, the $F_{BOL}$ must be modified by a percentage of retention (% R) as shown by the following chart:

| b/a | % R |
|---|---|
| 0.25 | 55% |
| 0.35 | 65% |
| 0.50 | 80% |
| 0.75 | 92% |
| 1.00 | 100% |

One specific embodiment of our invention was a four (4) tab shield which had a perimeter length of 7.6 inches, a shield wall thickness of 0.10 in., a tab length L of 0.5 inches, the thickness (t) of the tab equals 0.07 inches, a=0.5 inches, b=0.25 inches, $\theta=55°$. The force at the beginning of life ($F_{BOL}$) to be applied by such a shield is required to be 13.3 pounds. The force applied by the tabs directly correlates to the pressure applied by the shield because the force divided by the sealing edge area (perimeter length×shield wall thickness) equals the stress or pressure applied to the p.c. board by the shield. Testing has shown that the force at the end of life ($F_{EOL}$) must equal 4 pounds to achieve the minimum of 60 dB rf isolation. Because $F_{EOL}=0.38\ F_{BOL}\times\%$ R; in this example the $F_{EOL}=(0.38)(13.3)(0.8)=4.0$ pounds. Thus, this is an acceptable solution because the $F_{BOL}$ is greater than or equal to 4 lbs.

In a second specific embodiment of our invention, shield 10 had a perimeter length of 12.64 in., and a shield wall thickness of 0.085 in (therefore the sealing edge area is 12.64×0.085=1.07 in$^2$). The force at the end of life $F_{EOL}$ for sealing edge area of 1.07 square inches is 4 lbs.× (1.07÷0.76)=5.63 pounds. Also in this embodiment, b/a= 0.35 and, therefore, % R=0.65 from the above chart. Thus, the required $F_{BOL}$ can be obtained by the following equation:

$$F_{BOL} = \frac{F_{EOL}}{(0.38)(\% R)} = \frac{5.63}{(0.38)(0.65)} = 22.8 \text{ lbs}$$

Thus, the $F_{BOL}=22.8$ pounds.

In this second embodiment, it was first assumed that there would be four tabs, that $\theta=53°$, t=0.075 inches, L=0.5 inches and a=0.1 inches. Using the conventional FEA, the width of the tab was determined to be required to be increased a factor of 4.626 to achieve the required $F_{BOL}$. Thus, for a four tab design, the tab width (a) should be multiplied by 4.626. In other words, the snap width (a) should be 4.626×0.1 inches, which equals 0.462 inches. However, because of design constraints of this example, the snap width (a) can only be as large as 0.28 inches wide. Therefore, (0.462÷0.28)×4 snaps=6.6 snaps are required. In addition, we have found it preferable to add a 25% factor of safety to account for a 0.01 inch rms of tolerances in addition to the creep effect. Thus, the 6.6 snaps×1.25=8.25 snaps, which rounds up to 9 snaps. Therefore, the illustrated embodiment shows 9 snaps being used for a shield that has a perimeter of 12.64 inches and a wall thickness of 0.85 inches. This design will provide an adequate end of life force against the p.c. board so that effective shielding will be maintained through out the five year life of the shield.

According to the present invention, the method of determining the minimum number of securing devices (e.g., tabs) required on an electronic isolation shield for mounting on a circuit board and around an electronic component assembly to provide a minimum amount of shielding over a set period of time, includes the steps of:

ascertaining a creep strain for the material that the tab is made from;

determining the mathematical ratio between pressure applied by the securing devices at a beginning of the set period of time to the pressure that will be applied by the securing devices at the end of the set period of time due to the effects of creep;

determining the minimum amount of pressure that is required to be applied by the securing devices through the entire set period of time to provide the predetermined minimum amount of shielding; and determining the minimum number of securing devices that are required to apply the determined minimum pressure throughout the entire set period of time based on the determined mathematical ratio.

Having described the presently preferred exemplary embodiment of an electronic isolation shield and a method of determining the minimum number of securing points required on the shield to sufficiently secure the shield to the p.c. board, thereby providing a minimum level of shielding in accordance with the present invention, it is believed that other modifications, variations and changes will be suggested to those skilled in the art in view of the teachings set forth herein. It is, therefore, to be understood that all such modifications, variations, and changes are believed to fall within the scope of the present invention as defined by the appended claims.

What is claimed is:

1. An electronic isolation shield for mounting on a circuit board and having an upper and lower surface around an electronic component to provide a minimum amount of shielding over a set period of time, said shield comprising:

a body made from a shielding material sized and shaped to fit around and over said electronic component, said body having a sealing edge that is adapted to contact the upper surface of said circuit board and surround said electronic component; and means for forcing said sealing edge of said body into sealing engagement with said upper surface of said circuit board, said means comprising a plurality of resilient downwardly projecting tabs attached to said body and each of said tabs including a securing end that extends past said sealing edge, each of said tabs being securable to said circuit board along a securing axis; said forcing means being responsive to lateral displacement of said tabs with respect to said securing axis;

said tabs each having a planar surface at an angle to and in contact with the lower surface of said circuit board for laterally displacing a portion of said tab with respect to said securing axis continuously over said set period of time so that said forcing means forces said sealing edge into said circuit board sufficiently to provide said minimum amount of shielding to said electronic component over said set period of time, a cross-sectional area of said tabs measured in a plane parallel to and disposed above said sealing edge is greater than a cross-sectional area of said tab measured in a plane parallel to and disposed below said sealing edge.

2. The shield according to claim 1, wherein said body is cup shaped having an upper wall and a plurality of side walls depending downwardly from said upper wall.

3. The shield according to claim 2, wherein each of said side walls have a free edge disposed remote from said upper wall, said free edge collectively define said sealing edge.

4. The shield according to claim 1, wherein said securing end of said tabs has a curved outer surface to facilitate insertion of said securing end through a bore in said circuit board.

5. The shield according to claim 4, wherein said angle is greater than 10° and less than 80°.

6. The shield according to claim 1, wherein said angle is greater than 10° and less than 80°.

* * * * *